United States Patent
Nguyen

[19]

[11] Patent Number: 5,892,279
[45] Date of Patent: Apr. 6, 1999

[54] PACKAGING FOR ELECTRONIC POWER DEVICES AND APPLICATIONS USING THE PACKAGING

[75] Inventor: Ngon B. Nguyen, Jessup, Md.

[73] Assignee: Northrop Grumman Corporation, Los Angeles, Calif.

[21] Appl. No.: 570,051

[22] Filed: Dec. 11, 1995

[51] Int. Cl.$^6$ .............. H01L 23/06; H01L 23/10; H01L 23/34; H01L 23/52

[52] U.S. Cl. .............. 257/712; 257/706; 257/705; 257/714; 257/717; 257/723; 257/691; 361/699; 318/768

[58] Field of Search ............... 257/705, 712, 257/706, 714, 717, 723, 4, 686, 691, 678; 174/163; 318/768; 361/702, 699

[56] References Cited

U.S. PATENT DOCUMENTS

| | | | |
|---|---|---|---|
| 5,371 | 12/1847 | Kagawa | 257/664 |
| 4,965,710 | 10/1990 | Pelly et al. | 257/713 |
| 5,293,070 | 3/1994 | Burgess et al. | 257/712 |
| 5,398,160 | 3/1995 | Umeda | 257/711 |
| 5,463,250 | 10/1995 | Nguyen et al. | 257/698 |
| 5,532,012 | 7/1996 | Fillion et al. | 257/686 |
| 5,574,312 | 11/1996 | Bayerer et al. | 257/706 |

OTHER PUBLICATIONS

"IGBT (Insulated Gate Bipolar Transistor)", from Toshiba Data Book, 1991; GTR Module (IBGT); pp. 38–45.

*Primary Examiner*—Teresa M. Arroyo
*Attorney, Agent, or Firm*—Walter G. Sutcliff

[57] ABSTRACT

A packaging for high-power devices such as Insulated Gate Bipolar Transistors includes a direct bonded copper substrate (DBC), such as beryllium oxide (BeO), soldered directly to a heat generating surface of the high-power device. The direct bonded copper substrate (DBC) is, in turn, soldered directly to a liquid cooled heatsink (HS). The packaging improves the thermal management of the heat generated by the high-power device, and is applicable for use in a switching circuit for a 3-phase electric traction motor (M). The assembly also provides for improved wirebonding design in order to use each high-power device to its fullest.

48 Claims, 10 Drawing Sheets

PACKAGING FOR ELECTRONIC POWER DEVICES AND APPLICATIONS USING THE PACKAGING

BACKGROUND OF THE INVENTION

The present invention is directed generally to packaging for high power dissipation electronic devices, and more particularly to packaging for high power electronic chips and/or semiconductor devices, and applications of such packaging.

As advances in the manufacture of electronic devices, such as electronic or semiconductor chips, permit the devices to be made smaller in size, packaging for such devices is becoming outdated. A typical example of this evolution is with the insulated gate bipolar transistor (IGBT) chip, shown in FIG. 1. The chip is usually manufactured in the shape of a small rectangle including small parallel IGBT cells each having an emitter terminal E, a common gate terminal G, and a common collector terminal C on an opposite surface. High power IGBTs have been the devices of choice for most high current switch designs. IGBTs are normally assembled as high current switch power modules using standard semiconductor package design as shown in FIG. 2.

The collector surface C of the IGBT chip, which is the primary heat-generating surface, is soldered to a copper layer, which is further attached to a ceramic substrate soldered to a heavy copper base. These layers together with an external packaging form a unit which may be further attached, via a thermal grease layer, to a heat sink. The heat sink may be air-cooled or liquid-cooled depending on the application.

FIG. 2 shows that the packaging includes numerous layers, together with a heavy copper base, adding to the weight and bulkiness of prior art packaging. Moreover, the stackup construction of this packaging design has too many thermal barriers and is limited by poor thermal management for the high heat-generating IGBT chip. In addition, a layer of thermal grease or a thermal blanket must be used between the heavy copper base and the heat sink in order to insure the continuation of a thermal path between the device junction and the heat sink.

As the size of the IGBT chip evolves into a smaller size, the heat-generating surface also becomes smaller, and surpasses the thermal management (i.e., the cooling ability) of the prior art packaging design. For this reason, manufacturers will use several IGBT chips electrically connected in parallel in order to increase the heat-generating surface area. Although this parallel design also increases the current rating for the assembly, the current ratings for single IGBT chips continues to improve, and is often sufficient for a desired application. It is therefore undesirable for many applications to have multiple IGBT chips within the package.

Because the current rating for a single IGBT chip is often sufficient for the designer's application, the use of four IGBT chips does nothing but quadruple the cost for the assembly.

In short, the prior art packaging for IGBT chips (and other high power chips) results in a bulky, heavy, and costly packaging having poor thermal management.

The wirebonding of the prior art assembly for an IGBT chip is shown in FIG. 3. FIG. 3 shows four IGBT cells on the same IGBT chip connected in parallel and to the first copper surface of FIG. 2.

The wire bonding techniques used by prior art manufacturers, shown in FIG. 3, prevents the entire chip for each IGBT in the assembly to be used. A first wire bonding connection W1 connects a common emitter bar 10 to the emitter of a first IGBT cell 12. A second wire bonding connection W2 connects the emitter of the first IGBT cell 12 to the emitter of a second IGBT cell 14. As per Ohm's Law, the current flowing from the common emitter bar 10 to the first IGBT cell 12 meets only the resistance contained within wire bond connection W1 (=R1). The current flowing from the common emitter bar 10 to the second IGBT cell 14 meets the resistance of both wire bonding connections W1 and W2 (=R1+R2). Assuming that wire bond connection W1 has the same length as wire bond connection W2, the current flowing through the second IGBT cell 14 is one-half that flowing through the first IGBT cell 12 (i.e., 2R1 versus R1).

As a result, the current density and power density are not distributed evenly between the two parallel IGBT cells 12, 14. The junction to heat sink thermal resistance of the cell assembly increases significantly because the active area (i.e., the heat-generating area) lies primarily beneath the first IGBT cell 12, in effect reducing the active area by one-half. A similar analysis can be made for the remaining IGBT cells (not labeled) on the IGBT chip of FIG. 3.

Turning to FIGS. 4 and 5, the bulky packaging of the prior art is shown. These packages may be used to implement a 600 amp/600 volt 3-phase switch circuit, as shown in FIG. 6. Each switch in the circuit is capable of switching up to 600 amperes of peak current and blocking voltage up to 600 VDC. The three switches in the circuit can be used separately as three single-current switches, or connected in parallel to form a single 1800 ampere/600 VDC switch. Two of the same 3-phase switches can be used together to form a 600 amp/600 VDC 3-phase bridge circuit as shown in FIG. 7.

In FIG. 7, each switch includes a collector Ci, an emitter Ei, and an antiparallel or commutation diode Di. The Switch Si is activated through the transistor's gate Gi (not shown in FIGS. 6 and 7 for simplicity).

In order to form the 600 amp/600 volt 3-phase bridge 11 of FIG. 7, six single 600 amp/600 volt IGBT switch modules or three dual 600 amp/600 volt IGBT switch modules are used. Each switch module includes collector terminals Ci, emitter terminals Ei, gate terminals Gi, and commutation or anti-parallel diodes Di. These labels correspond to those shown in FIGS. 4 and 5 for the prior art packaging. The bridge circuit is designed by connecting the switch circuits between high current buses ("+" and "−") of a propulsion battery. Each phase of the 3-phase traction motor M is connected to a corresponding pair of IGBT switches, in the manner shown in FIG. 7. Each pair of switches, connected between the high current buses, are also connected to respective high-capacity capacitors CP1–CP3.

As shown in FIG. 8, the prior art IGBT modules may be screwed to a liquid-cooling heat sink. External bus bars and screw connections are used to connect the high current buses and the capacitors (only one of which is shown in FIG. 8). The final assembly of the discrete bridge of FIG. 8 measures approximately 4.5×12×1.5 inches, and weighs approximately 20 pounds. The long distance connection between the propulsion battery, the drive/control circuit board (not shown), and each of the IGBT modules causes undesirable oscillations that can seriously affect the reliability of the power devices.

As a result, the prior art packaging for electronic devices, such as high-current IGET chips, are bulky, heavy, unnecessarily expensive, and suffer from poor thermal management due to numerous thermal barriers and inefficient wire bonding techniques. Their assembly or repair also requires the tedious disconnection of the several components seen in FIG. 8. Furthermore, the IGBT power modules using standard package design cannot be hermetically sealed, and use silicon gel coatings and molded covers which are not approved for most military or high-reliability applications.

SUMMARY OF THE INVENTION

It is an object of the present invention, therefore, to provide an improvement in the packaging for electronic devices.

It is a further object of the present invention to provide an improvement in the packaging of electronic devices such as high-power IGBT switches or other semiconductor power devices.

It is another object of the present invention to provide a bare chip packaging technique using advanced packaging materials.

It is still another object of the present invention to provide packaging for high-power switches forming a 3-phase integrated switch which is applicable for use in a bridge circuit in high-power applications such as an electric vehicle.

These and other objects are obtained by providing a packaging for an electronic device comprising at least one electronic device having a heat generating surface, and a direct bonded copper substrate having a first surface in thermal contact with the heat generating surface. Other objects are obtained by providing a packaging for an insulated gate bipolar transistor chip comprising a plurality of first units, each first unit including a plurality of insulated gate bipolar transistor chips having respective collector surfaces, and a direct bonded copper substrate having a first surface soldered to said collector surfaces; a liquid cooled heat sink soldered to a second surface of said direct bonded copper substrate, the second surface being opposite the first surface.

The invention is designed to qualify for both commercial and military applications (i.e., for dual use). The novel packaging technique of the present invention provides improved cooling at a lower cost, while providing a smaller, lighter product which may be adapted for various applications. In order to obtain the best thermal management for high-power devices, the packaging of the present invention may be soldered directly on a liquid-cooling heat sink such as microchannel cooling heat sink.

When adapted for use with an electric traction motor, the packaging preferably includes a plurality of insulated gate bipolar transistors on each of said first units forms a pair of high-power switches, three of said first units soldered to said liquid cooled heat sink; a 3-phase electric traction motor, each phase of which is connected to a respective pair of said high-power switches; a propulsion battery having positive and negative bus bars, the bus bars being electrically connected to said pairs of high-power switches; and a controller for controlling the switching operation of said high-power switches so as to control said 3-phase electric traction motor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 9:
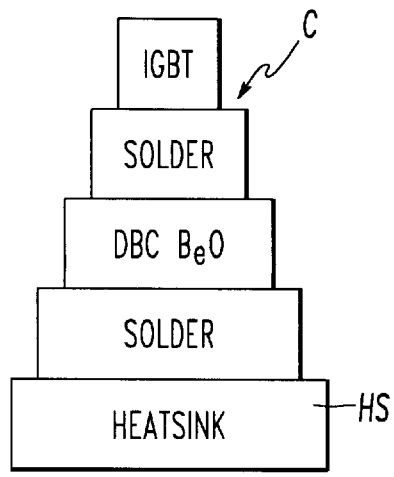
FIG. 9 shows the stack up packaging design according to one preferred embodiment of the present invention.

FIG. 9 shows the stackup packaging design according to one preferred embodiment of the present invention. Although an IGBT chip is shown, it should be understood that any heat-generating electronic device, such as other semiconductor chips or high-power switching devices may be used. The packaging is applicable for use in cooling any heat-generating electronic device, but is preferably used for power devices rated for 100 Watts or more.

In FIG. 9, both the IGBT and the diode chips (not shown) are preferably soldered directly on a direct bonded copper (DBC) beryllium oxide (BeO) substrate. Although a DBC BeO substrate is preferred, it should be understood that any high thermal conductivity substrate, such as high-conductivity ceramics, or aluminum nitride, or a thermal clad layer such as a Bergquist material (for lower current applications) or CVD may be used in place of the BeO substrate, so long as the substrate is metallized by copper or other suitable metals. For simplicity, the term "direct bonded copper substrate" as used herein and throughout the claims is intended to include each of these variations. The DBC BeO layer is then soldered directly on the surface of a heat sink HS. In a preferred embodiment, the heat sink HS is a liquid-cooled heat sink but it may be an air-cooled heat sink or a liquid-cooled microchannel heat sink.

The DBC BeO layer used in this packaging design benefits high powered IGBTs and high powered diodes by providing excellent thermal and electrical conductivities due to the copper material. The equivalent thermal conductivity of the DBC substrate used in this packaging assembly is estimated using:

$$K_{eq} = \sum_{i=1}^{n} K_i t_i / \sum_{l=1}^{n} t_i \quad (1)$$

where, $K_i$=thermal conductivities of materials $t_i$=the thicknesses of materials In a preferred embodiment, using the above packaging, the result of this calculation was found to be 7.65 watt/degrees C.-inch.

The static junction to heat sink thermal resistance of each IGBT chip is estimated using:

$$\theta = 1/A \sum_{i=1}^{n} t_i/k_i \quad (2)$$

where,

A=the active area of the device $t_i$=the thickness of the device and materials $k_i$=the thermal conductivities of the materials For the preferred packaging shown in FIG. 9, the result of this calculation was found to be less than 0.042 degrees C./watt. The transient junction to heat sink thermal resistance for the same IGBT is estimated for a 100 millisecond power pulse using:

$$\theta = tP/ \sum_{i=1}^{n} APC_i t_i \quad (3)$$

where, t=duration of the power pulse

A=the active area of the device

P=the density of the materials $C_i$=specific heat of the materials $t_i$=the thickness of materials For the design shown in FIG. 9, the result of this calculation was found to be less than 0.024 degrees C./watt. Both calculations take into account only vertical thermal transfer, suggesting that the inventive packaging design would provide even lower thermal resistance values when horizontal thermal spreading is taken into account.

The above calculations show that the packaging design of FIG. 9 satisfies the critical requirements of a 600 amp/600 volt switch used in a 3-phase bridge inverter 11 of an electric vehicle propulsion system. In this application, the inverter is a high-power interface between the traction motor and the propulsion battery as previously discussed with respect to FIG. 7. The circuit's function 11 is to convert the battery output power to a 3-phase AC current source that can drive a traction motor, e.g., an induction motor, at its rated horsepower. This bridge can be used as an inverter in a propulsion system that can drive a traction motor M of an electric vehicle rated at up to 100 hp, for example.

A 100 hp EV propulsion system designed using a single 600 amp/600 volt 3-phase bridge inverter requires each switch of the bridge to switch an RMS current up to 382 amperes and a peak current up to 600 amperes. It must be capable of blocking a minimum DC voltage of up to 600 volts. Parallel IGBTs and their matching commutation diodes are normally used for each switch. To maintain the reliability of these devices over the operating temperature range, the maximum junction to heat sink differential temperature of each device must be kept below 25° C.

The switch design for the present invention uses two parallel 300 amp/600 volt IGBT bare chips and two anti-parallel 150 amp/600 volt fast and soft recovery diode bare chips for each switch. These chips are readily available, with each IGBT chip conducting a 191 ampere RMS current, and 300 ampere peak current. It dissipates an average power of approximately 516 watts (191 amp×2.7 volts) and a peak power of approximately 810 watts (300 amp×2.7 volts). Since the surface area of each IGBT chip measures approximately 0.45 square inches (0.750"×0.600"), the average and maximum power densities of each IGBT chip are, respectively, 1147 watt/square inch and 1800 watt/square inch. In order to effectively remove these extremely high power densities from each IGBT chip while maintaining the differential temperature between the junction of each chip and its heat sink to below 25° C., the static and transient junction to heat sink thermal resistances for the chip must be less than 0.048 degree C./watt and 0.031 degree C./watt, respectively. Each diode in the switch conducts approximately 64 ampere RMS current at a 150 ampere peak current. Its performance will be satisfied with the same thermal resistances of the IGBT discussed above.

As previously discussed in relation to equations 1–3, the packaging design of the present invention satisfies the serious thermal management constraints, while using fewer stackup materials.

Figure 10:
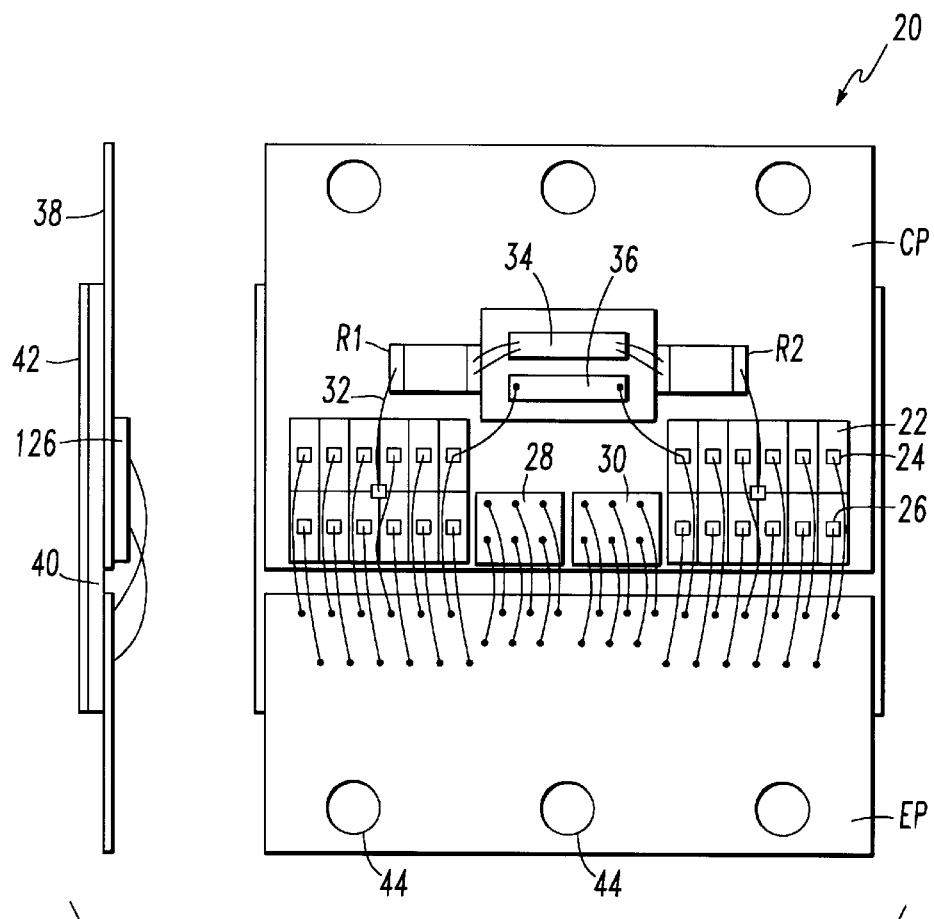
FIG. 10 shows a 600 amp/600 volt IGBT switch using the stack up packaging design of FIG. 9 according to one preferred embodiment of the present invention.

FIG. 10 shows a practical application of the packaging assembly of FIG. 9. The application shown in FIG. 10 corresponds to a IGBT switch unit 20 including, in a preferred embodiment, a pair of IGBT chips each having twelve IGBT cells 22. Each emitter terminal 24 for the IGBT cells is connected via a 0.020" diameter aluminum wire bond 26 to a common emitter pad EP.

Figure 1:
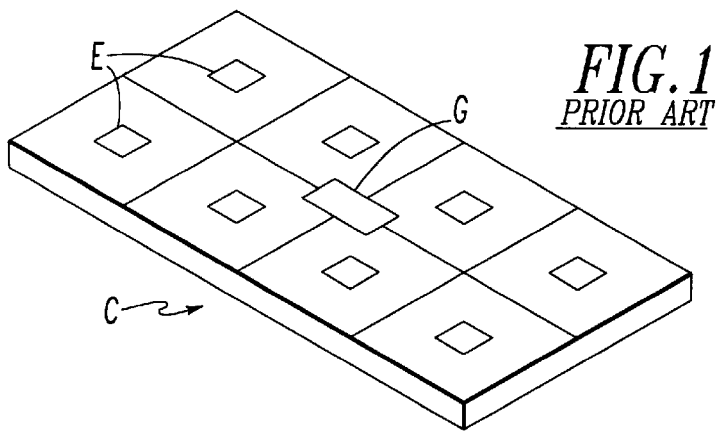
FIG. 1 shows a prior art IGBT chip.
Figure 2:
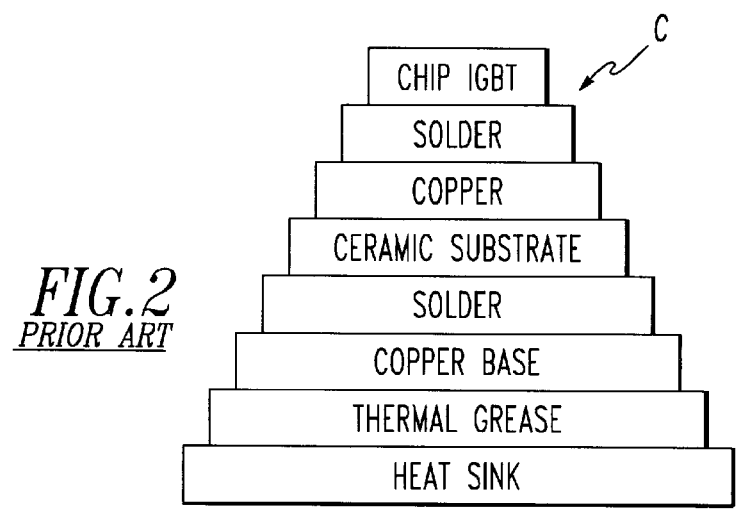
FIG. 2 shows a prior art stackup packaging design.
Figure 3:
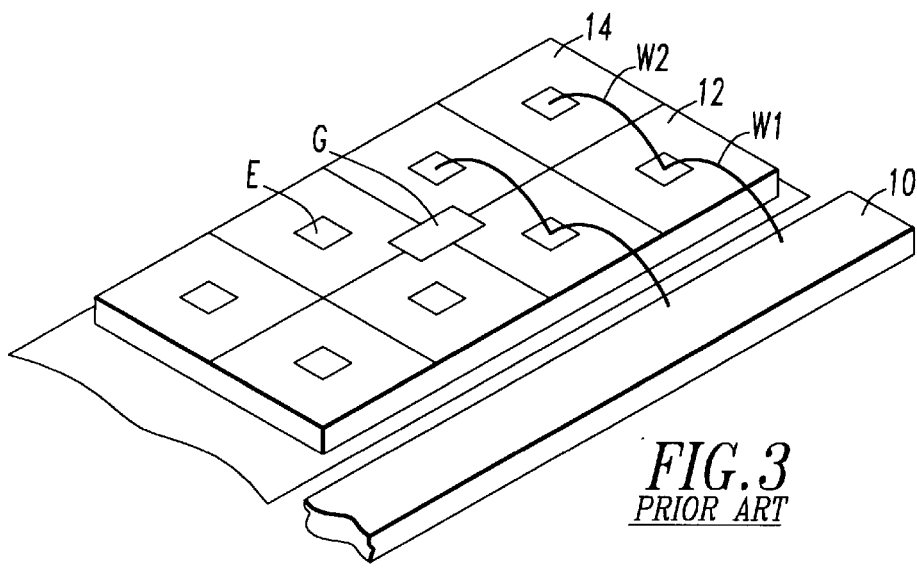
FIG. 3 shows a prior art wire bonding method.

An important feature of the wire bonding interconnections developed for the present invention includes using identical length wire bond interconnections 26 for every IGBT emitter 24. In contrast to the wire bonding technique of the prior art, shown in FIG. 3, the wire bonding of the present invention permits each IGBT cell to be used to its full ability. That is, the resistance of each wire bonding interconnection 26 is identical, allowing equal current to pass from the common emitter pad EP to each IGBT cell 22. Because each IGBT cell passes an equal current, each collector for the IGBT cells produces similar heat thereby increasing the heat-generating surface area and thus the thermal efficiency of the present invention. The same wire bonding technique may be used for the anti-parallel diodes 28, 30. The switch of FIG. 10 further includes a pair of common gate connections 32 which connect internally to the transistor gates in the IGBT arrays. The common gate connections 32 connect through resistors R1, R2 to a contact 34 which may be connected directly to an external gate drive circuit. Similarly, the emitters of the IGBT chips are commonly connected to a contact 36 which is connected to an external emitter return of the gate drive circuit.

As seen in the cross-section of FIG. 10, the collectors of the IGBT chips are commonly mounted on a first copper layer 38 of the DBC substrate which forms a common collector pad CP. Common collector pad CP is separated from the common emitter pad EP by a gap 40. The collector pad CP and emitter pad EP are mounted to a common BeO (or other) substrate as discussed above. The BeO substrate has, as its other direct bonded copper layer, a further copper layer 42.

Figure 11:
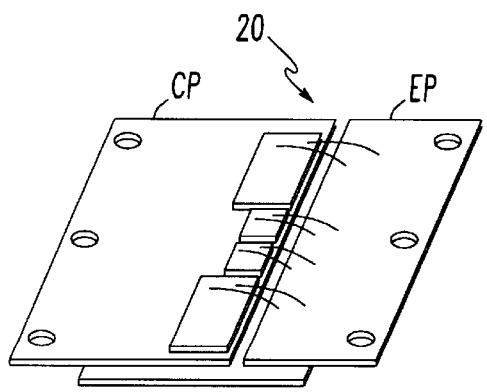
FIG. 11 shows an elevational view of the switch of FIG. 10.

It is possible to extend the length of the collector pad CP and/or emitter pad EP to form wings (with or without holes 44) in order to simplify the connection of the unit 20 to bus bars or to low insertion force (LIF) high current connectors, as will be described below. These wings can be seen in better detail in FIG. 11.

Figure 12:
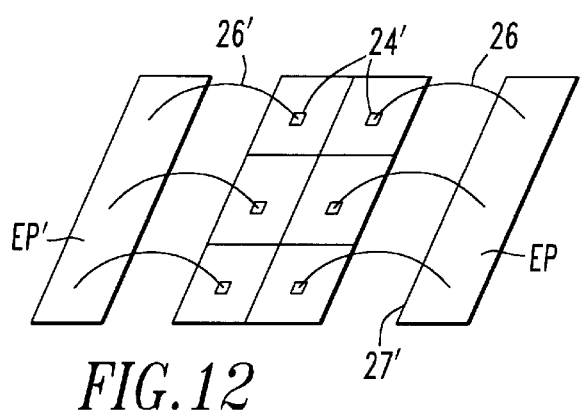
FIG. 12 shows an alternative wire bonding technique according to another preferred embodiment of the present invention.

As an alternative to the wire bonding technique described in relation to FIG. 10, separate emitter pads EP' (which may, in turn, be commonly connected elsewhere on the unit 20) can be provided with respective wire bonding interconnections 26' all of equal length. The wire bonding interconnections 26' are perpendicular to an edge 27' of the emitter pads EP', and connect individual rows of IGBT emitters 24' to the pads EP'. See FIG. 12. Each of the pads described herein, including the common emitter pads and the common collector pads, is encompassed by the generic term "common conduction pad" as used in both this specification and the appended claims.

Figure 4:
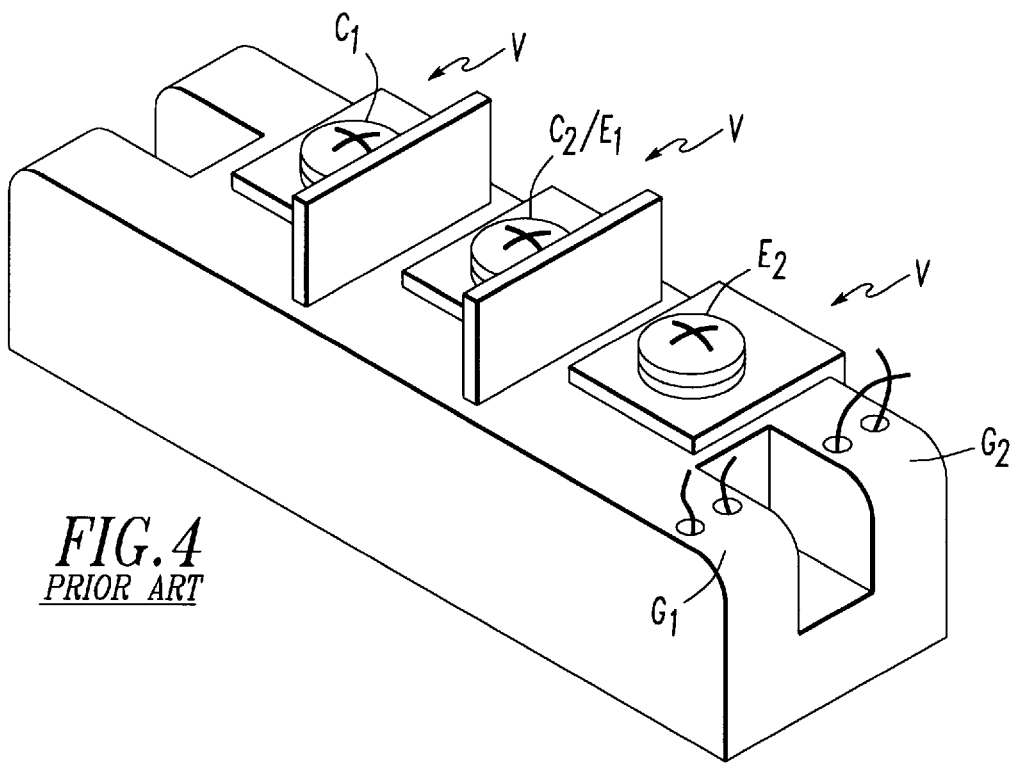
FIG. 4 shows a prior art IGBT package.
Figure 5:
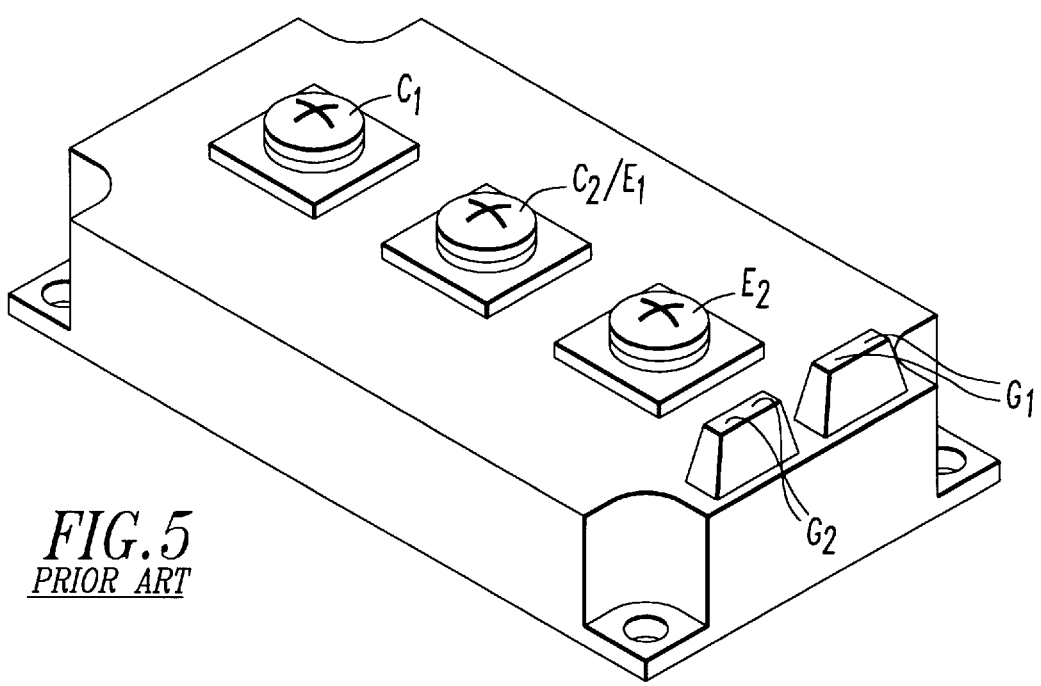
FIG. 5 shows a prior art IGBT package.

The extensions, or wings, created by the emitter and collector pads extending further from the edge of the substrate allows the IGBT switch to be connected directly to the main bus bars of a power source, such as a propulsion battery. These wings allow shorter high current pads between the power devices and bus bars, and avoids the need for the long and small size vertical brackets used in the prior art. As seen in FIG. 4, the prior art vertical brackets V are required for standard semiconductor package designs, and are difficult to assemble. Their use adds undesirable parasitic inductance to the conduction paths, as well as conduction losses introduced by their solder connections. In other words, the present invention allows the high current bus bars to be short and close to one another, and also allows the use of LIF high current connectors.

Because the current in these high current bus bars travels in opposite directions and creates opposite flux fields, the present invention advantageously allows these flux pads to cancel one another and thereby reduces the parasitic induction experienced in the prior art.

Figure 6:
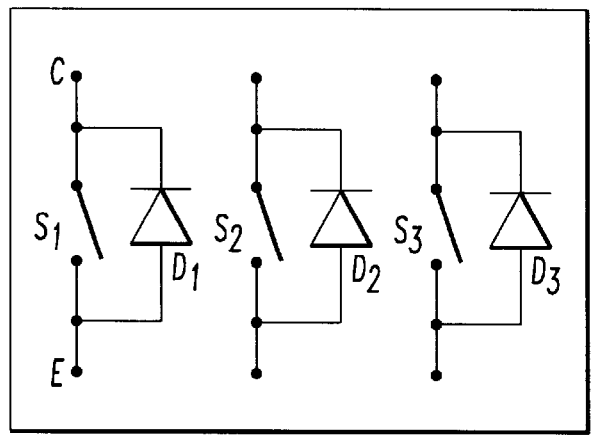
FIG. 6 shows a prior art 600 amp/600 volt 3-phase switch circuit.
Figure 13:
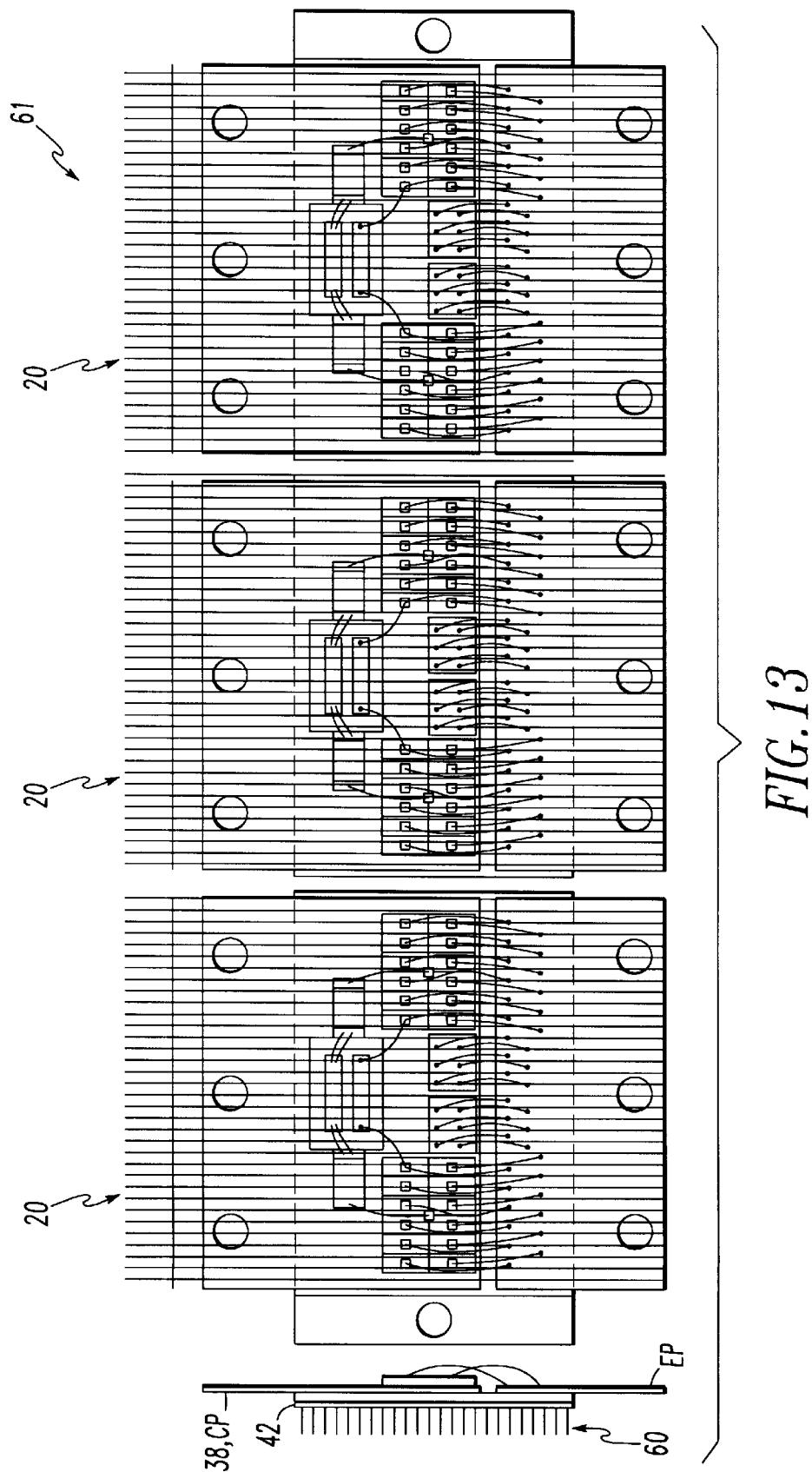
FIG. 13 shows a heat sink supporting a plurality of the switches of FIG. 10 according to a preferred embodiment of the present invention.

In order to implement the 600 amp/600 volt 3-phase switch circuit shown in FIG. 6, the present invention allows three of the dual switch units 20 of FIG. 10 to be mounted on a heat sink as shown in FIG. 13. It should be understood, however, that the preferred embodiment shown in FIG. 10 is illustrative only, as other variations using the stackup packaging design of the present invention will become apparent upon the description contained herein.

Figure 15:
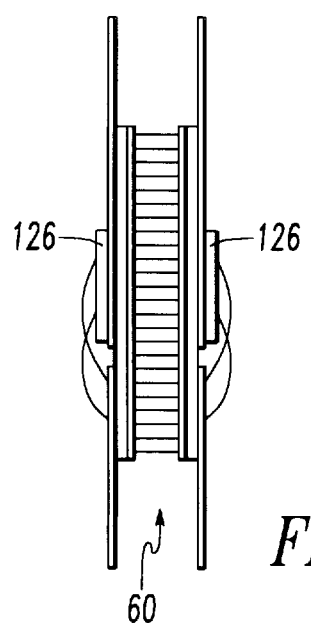
FIG. 15 shows an alternative assembly for that shown in FIG. 13 according to another preferred embodiment of the present invention.

As seen in FIG. 13, the mounting of several IGBT switches to a common heat sink 60 provides a convenient component 61 designed specifically for ease of connection and/or disconnection. Regardless whether the heat sink is air-cooled or liquid-cooled, the versatility of the present invention is further seen in FIG. 15, wherein IGBT switches are connected on both sides of the heat sink 60.

Figure 14:
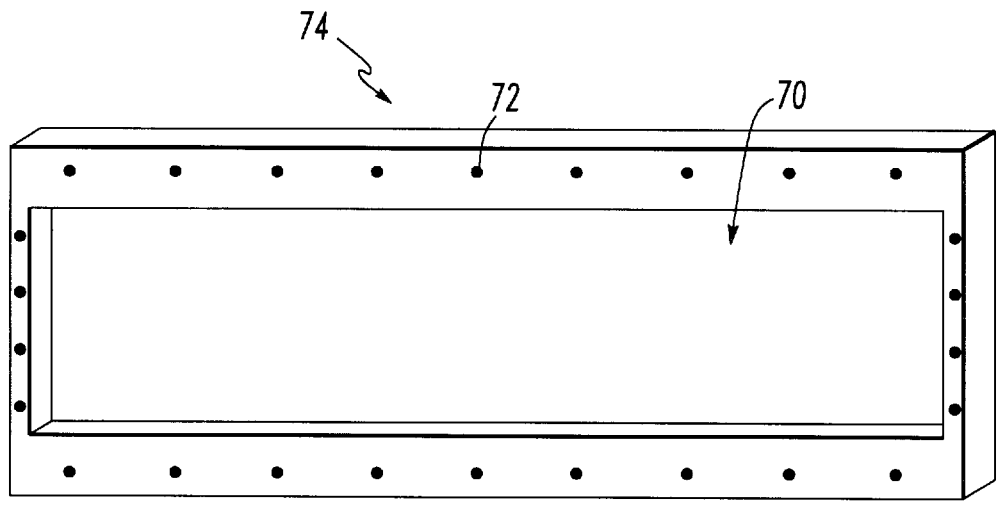
FIG. 14 shows a plastic cover for use with the assembly of FIG. 13 according to a preferred embodiment of the present invention.

For commercial applications, the assembly of FIG. 13 may be coated with a silicon gel type of coating and covered with a simple cover. In order to seal the chips from exposure, the cover, preferably plastic, with a cavity having an appropriate depth for the IGBT chips and wirebonds can be sealed over the chips. A preferred plastic cover 74 is shown in FIG. 14, with the cavity 70 shown. The depth of the cavity may be, for example, 0.200". The plastic cover can be adapted to seal chips from both sides, either using separate isolated cavities, or a single common cavity exposed on both ends. Mounting holes 72 can also be provided in the plastic cover.

Figure 16:
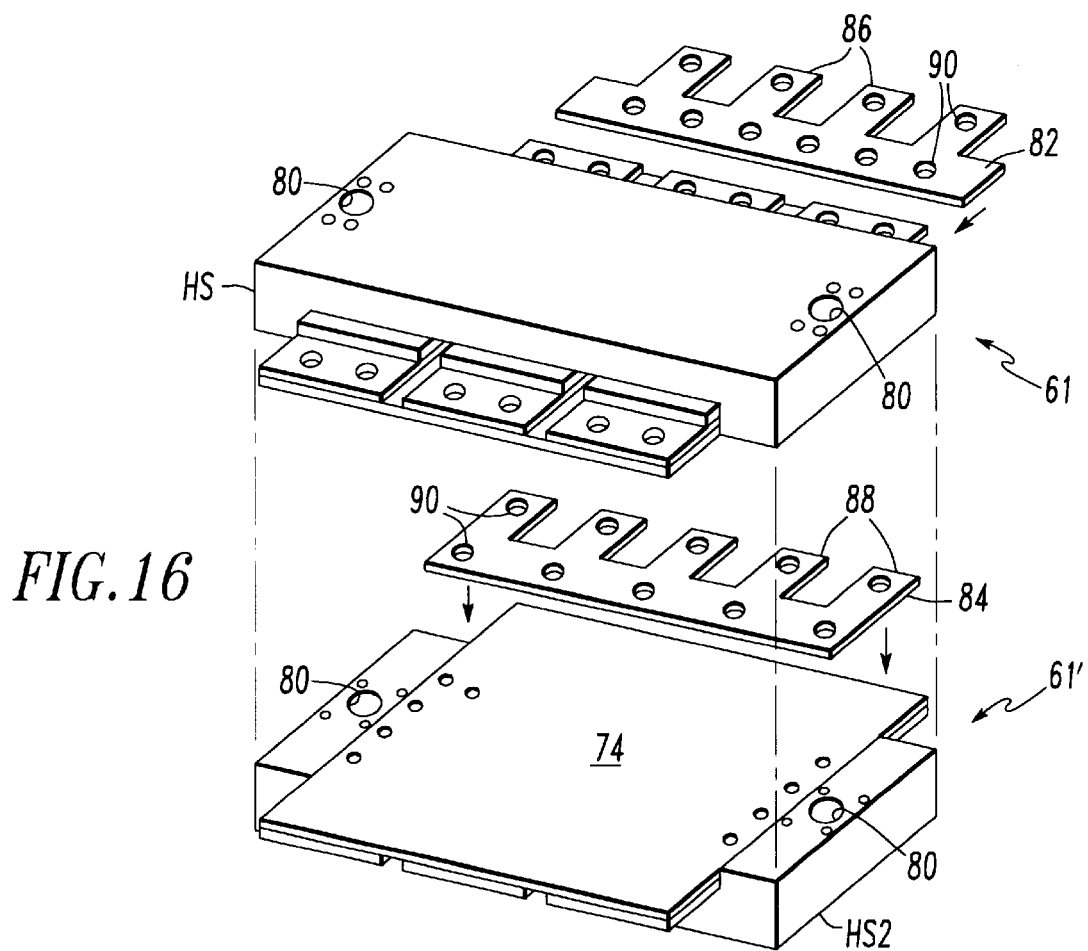
FIG. 16 shows an exemplary assembly of the packaging technique according to another preferred embodiment of the present invention.

The utility of the present invention is further illustrated in FIG. 16. In FIG. 16, two components 61 previously shown in FIG. 13 and sealed with plastic covers 74 are shown in alignment. The heat sinks include liquid passages 80, although air-cooled heat sinks may be used. In order to further simplify the connection of the units to the bus bars of a power source, a common collector bus bar 82 and a common emitter bus bar 84 may be provided. As will be explained in connection with FIG. 17 below, the collector bus bar 82 and emitter bus bar 84 are provided with protruding teeth 86, 88 which are offset from one another. Mounting holes 90 may also be provided.

Figure 7:
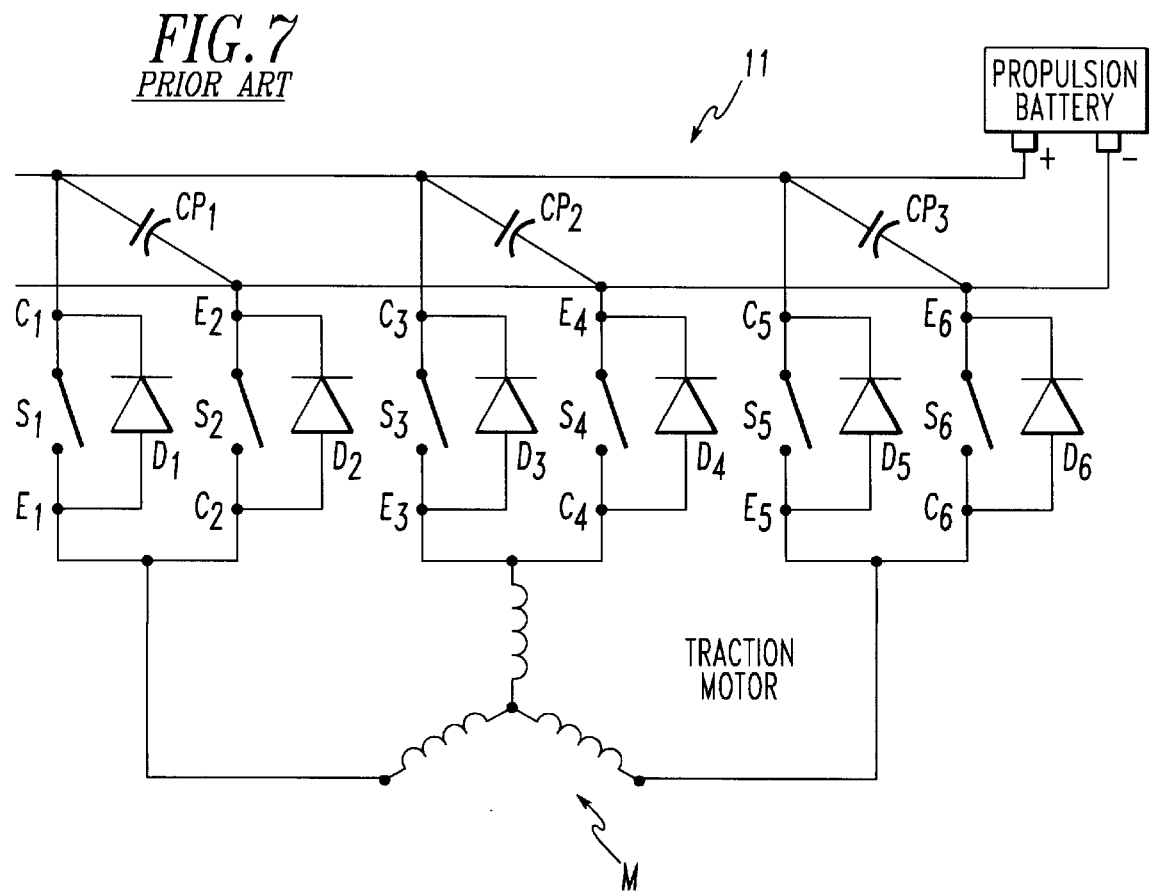
FIG. 7 shows a prior art 600 amp/600 volt 3-phase integrated bridge circuit.

By mounting the IGBT switches in the manner shown in FIG. 16, the circuit of FIG. 7 can be constructed using the inventive packaging described herein into a versatile and convenient assembly. The emitter pad EP of a first switch can be connected directly to the collector pad CP of a second switch, as seen in FIG. 7 between emitter E1 and collector C2. This connection can be implemented using a load connector 100 seen in FIG. 18. The load connector is designed to clear the spacing formed by plastic cover (or covers) 74 and connects to the load of the switch.

With this arrangement, the collector pad for the collector C1 and emitter pad for the emitter E2 can be connected to respective high current buses using the collector bus bar 82 and emitter bus bar 84, respectively.

Figure 18:
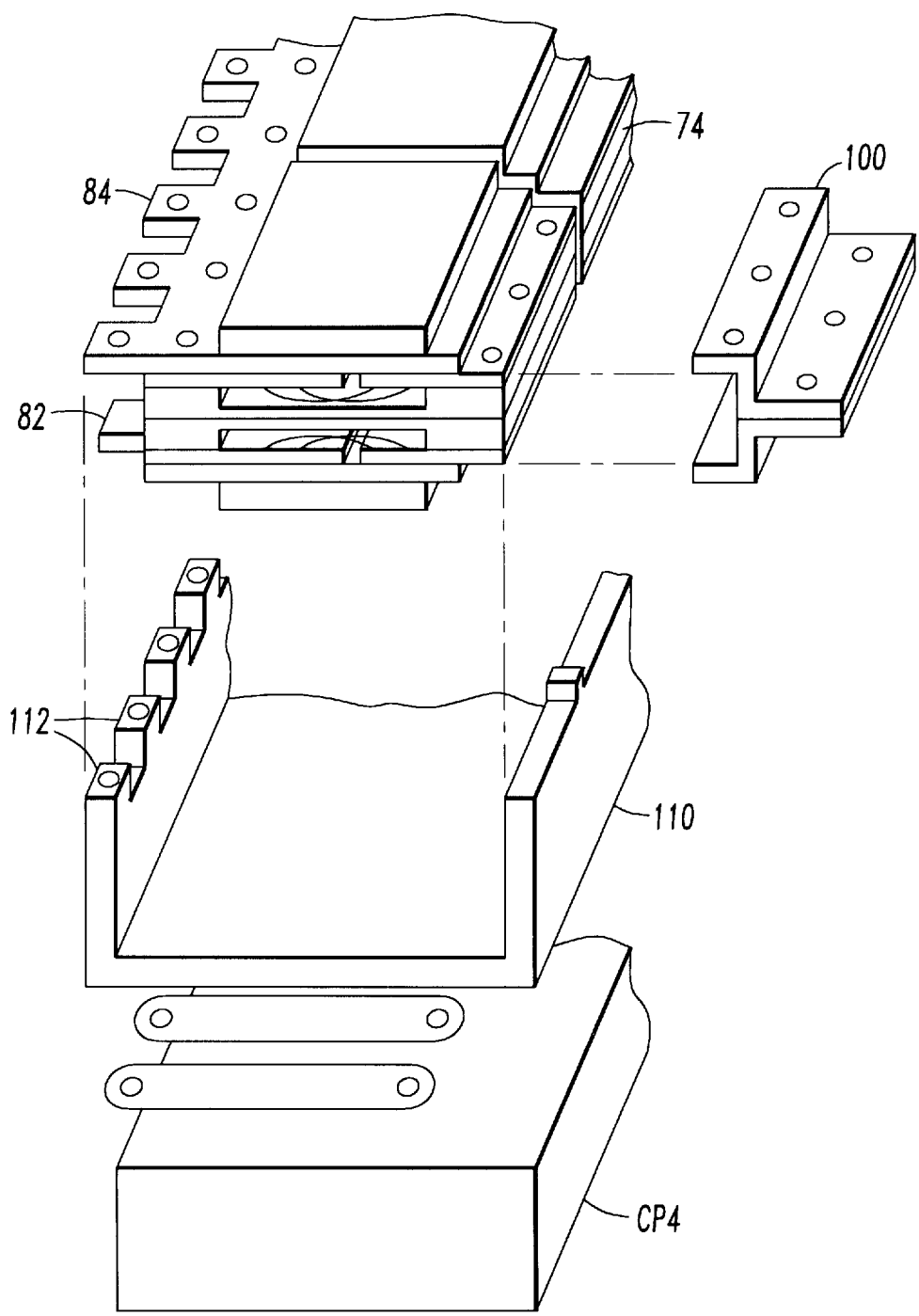
FIG. 18 shows the separate components in an elevational view for the assembly of FIG. 17.

In a preferred embodiment, the assembly of FIG. 18 can be connected to the bus bars and capacitor via a mounting base 110. The mounting base 110 has protrusions 112 which correspond in spacing to the spacing of the extensions 86, 88 of the collector bus bar 82 and emitter bus bar 84 seen in FIG. 16 (e.g. two inches between protrusions). By using mounting screws, the emitter bus bar 84 and collector bus bar 82 can be directly connected to the high current buses of a power source.

Figure 17:
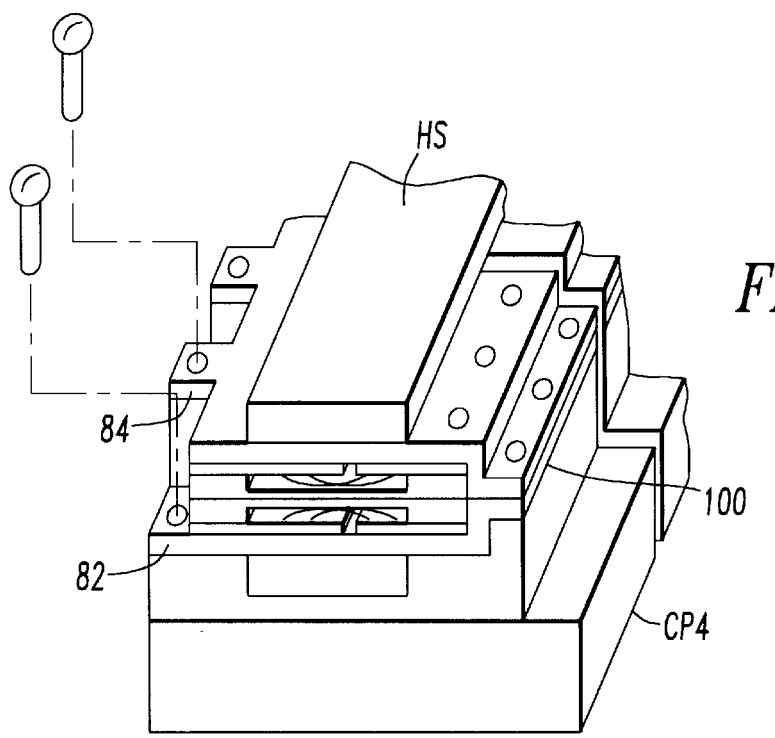
FIG. 17 shows an exemplary application of the packaging technique of the present invention according to another preferred embodiment of the present invention.

FIG. 17 shows the complete interaction between the stackup packaging of the present invention, the inventive offset wire bonding, the attachment of the packaging to a heat sink, the use of plastic cover(s) 74, the collector and emitter bus bars 82, 84, the load connector 100, the mounting base 110, and underneath-mounted capacitor CP4.

As an alternative, the collector bus bar 82 and emitter bus bar 84 can be directly connected to the bus bars of the propulsion battery, with the capacitor still mounted beneath the mounting base (or elsewhere). In any event, the present invention permits the bus bars of the propulsion battery to be placed close together, or one on top of the other. Their proximity permits their respective flux fields to cancel one another, thereby further improving performance by reducing parasitic inductance and other undesirable effects. For example, the assembly of FIG. 16 allows one of the bus bars 82, 84 to be directly connected to the propulsion battery and to sit directly on top of the other, separated by an insulation layer such as plastic. The flux generated by these bus bars cancel one another, reducing or eliminating the parasitic inductance of the bus bars.

Figure 8:
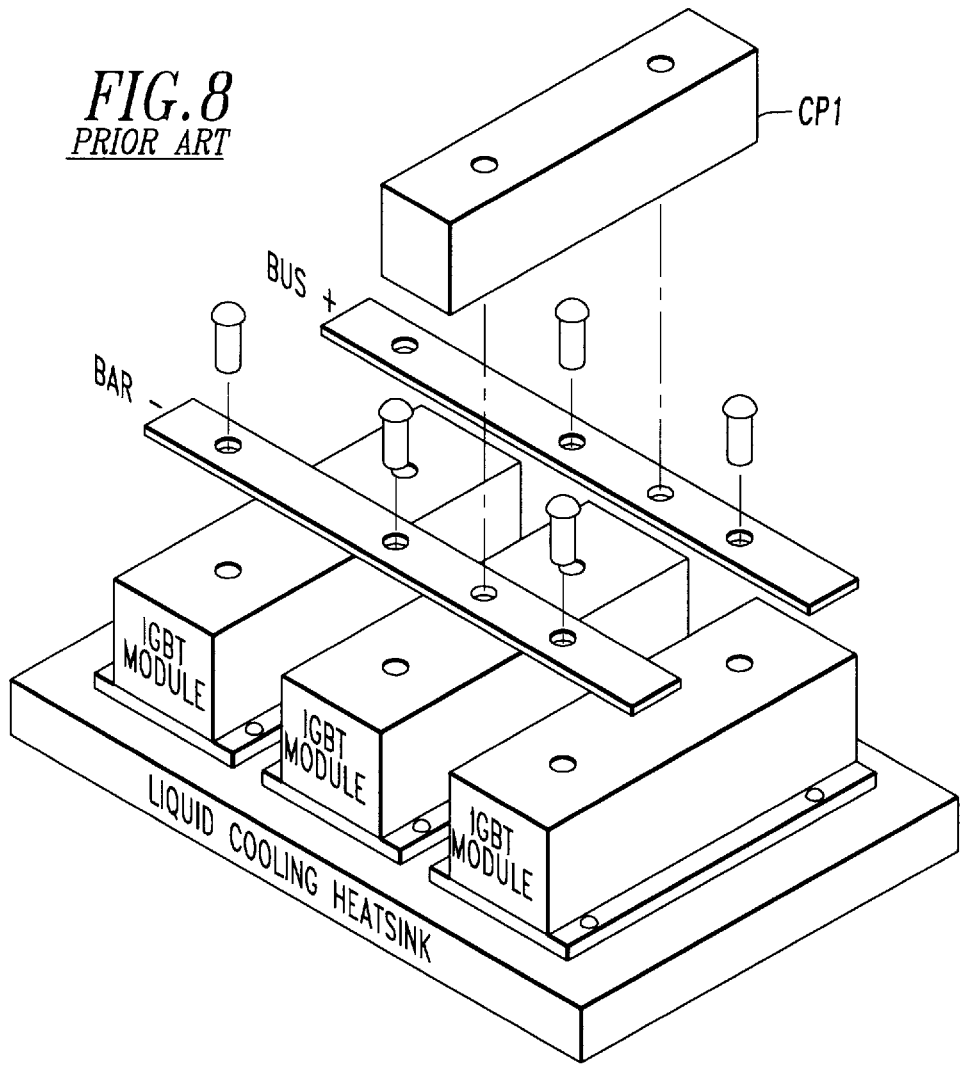
FIG. 8 shows the prior art assembly for the circuit shown in FIG. 7.

In contrast to the prior art assembly of FIG. 8, the present invention provides for simpler mounting and/or replacement of the high-power switching devices. As seen in FIG. 8, when an IGBT module fails, replacement of the module requires removal of the capacitor Cl, removal of the bus bars, removal of the faulty module, and subsequent replacement of each of these parts.

The present invention allows the faulty IGBT module to be replaced by simply removing a few mounting screws. In an alternative embodiment, the use of quick connect/disconnect devices, similar to plug-in connections used with computer boards, may be used. This would further simplify the assembly and/or repair of the power devices. The fully assembled unit is seen in FIG. 17.

The present invention permits the drive and control circuitry for the bridge circuit (not shown in FIG. 7) to be mounted directly on the plastic cover 74 or even on the heat sink. This allows the control signal lines to be very short, in the order of about ½ inch from the power devices. The connection from the drive and control circuitry to the connections 34, 36 of FIG. 10 may be implemented by wiring or by pin connectors.

In order to satisfy the stringent requirements of military applications, the present invention is easily adapted to be hermetically sealed. As seen in FIG. 10, the IGBT switch of the present invention includes a collector pad CP separated from an emitter pad EP by a gap 40. Although a cover may be designed to fill the gap 40, it is preferable to modify the packaging structure in the manner shown in FIG. 19.

Figure 19:
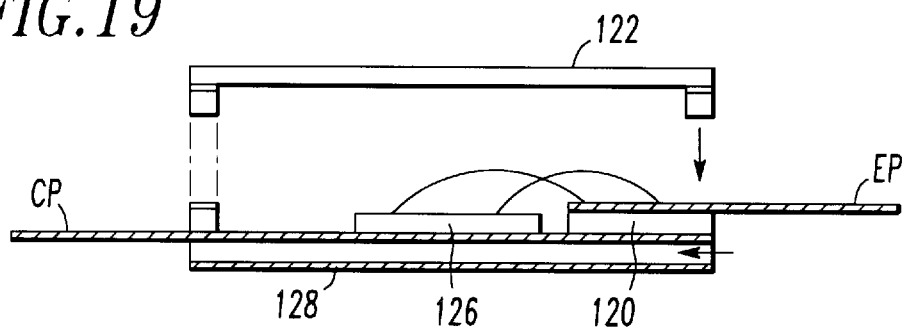
FIG. 19 shows a hermetically sealed packaging according to another preferred embodiment of the present invention.
Figure 20:
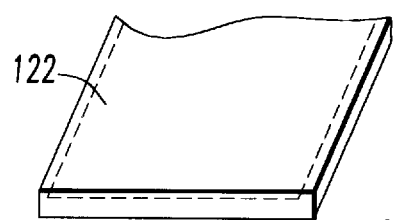
FIG. 20 shows an elevational view for the assembly of FIG. 19.

In FIG. 19, the emitter pad CP is elevated from the collector pad EP by an additional layer 120. A solderable insulated lid 122 can be adapted to fit over the emitter pad EP so as to hermetically seal the package within its walls. As seen in the elevated view of FIG. 20, a preferred embodiment of the present invention contemplates the use of a copper ring 124 for the emitter pad EP which can be used to solder or braze the hermetic lid 122. A weldable or solderable lid is required to be used with the ring 124.

Figure 21:
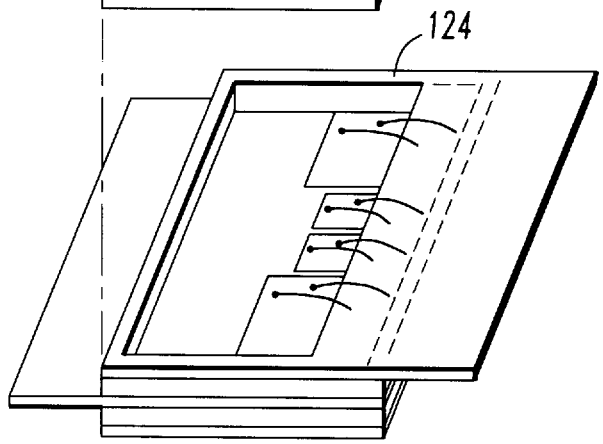
FIG. 21 shows a variation of the assembly of FIG. 19 according to another preferred embodiment of the present invention.
Figure 21:
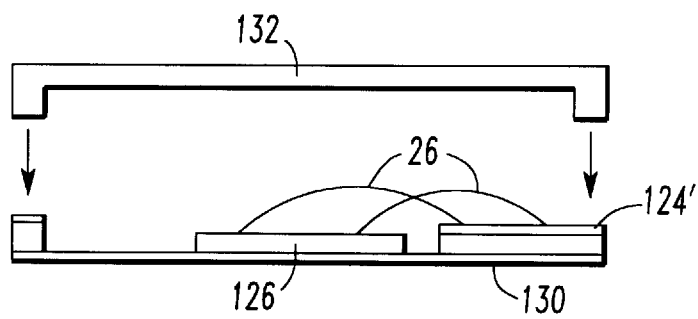

As a further variation, a "hockey puck" packaging design can be used. FIG. 21 shows the hockey puck design, wherein the wings of the emitter pad EP and collector pad CP are omitted. Instead, a metal (or other electrically conductive) lid 132 is welded or soldered to the copper ring 124' which is connected by wire bonding to the emitter terminals of the IGBT switch 126. The collector surface of the IGBT switch 126 is soldered to a copper plate 130. The hockey puck design also omits the lower BeO layer and opposing copper layer 128 of FIG. 19 in order to permit electrical connections to be secured directly to the top and bottom of the package.

It should be understood that the alternative packaging of FIGS. 19 and 21 may incorporate any of the variations discussed above, including alternative direct bonded copper layers and wire bonding techniques.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A packaging for an electronic device comprising:
   at least one electronic device having a heat generating surface;
   a direct bonded copper substrate having a first surface lying on a substrate portion of said direct bonded copper substrate;
   a heat sink in thermal contact with a second surface of said direct bonded copper substrate;
   a first solder connection directly connecting the first surface of said direct bonded copper substrate and the heat generating surface of said electronic device; and
   a second solder connection directly connecting the second surface of said direct bonded copper substrate and a first side of said heat sink,
   wherein the first surface extends beyond an edge of the substrate portion of said direct bonded copper substrate thereby forming a wing which is generally coplanar with the first surface.

2. The packaging of claim 1, wherein the first surface and the second surface lie on opposite sides of said direct bonded copper substrate.

3. The packaging of claim 1, further including:
   at least one second electronic device having a heat generating surface;
   a second direct bonded copper substrate having a third surface soldered to the heat generating surface of said at least one second electronic device, and a fourth surface on a side opposite the side of the third surface; and
   a third solder connection directly connecting the fourth surface of said second direct bonded copper substrate and a second side of said heat sink, such that said heat sink is sandwiched between said at least one electronic device and said at least one second electronic device.

4. The packaging of claim 1, wherein said heat sink is a liquid cooled heat sink.

5. The packaging of claim 4, wherein said liquid cooled heat sink is a microchannel liquid cooled heat sink.

6. The packaging of claim 1, further including:
   a cover for covering the at least one electronic device, the cover including a cavity along a first surface thereof, the cavity formed to accept the at least one electronic device.

7. The packaging of claim 1, further including:
   a plurality of said electronic devices arranged adjacent one another on said direct bonded copper substrate, each of said electronic devices being a semiconductor chip having a respective heat generating surface soldered to the first surface of said direct bonded copper substrate and having a respective first connection point;
   a first common conduction pad disposed to one side of said plurality of connection points such that a shortest distance between an edge of said conduction pad to the first connection point of a first semiconductor chip differs from a shortest distance from the edge to the first connection point of a second one of said semiconductor chips; and
   a plurality of wirebonds of equal length, a first wirebond being connected to the first connection point of the first semiconductor chip and to said first common conduction pad, and a second wirebond being connected to the first connection point of the second semiconductor chip and to said first common conduction pad, such that said plurality of semiconductor chips are connected in parallel to said first common conduction pad.

8. The packaging of claim 7, wherein said common conduction pad is a copper layer included in said direct bonded copper substrate.

9. The packaging of claim 7, wherein said semiconductor chips are identical Insulated Gate Bipolar Transistors having emitters at their respective first connection points, and further wherein said first common conduction pad is an emitter pad wirebonded through said plurality of wirebonds to the emitters of said Insulated Gate Bipolar Transistors.

10. The packaging of claim 9, wherein each of said Insulated Gate Bipolar Transistors further includes a respective collector surface, the packaging further comprising:

a second common conduction pad, said second common conduction pad being electrically connected to the collector surfaces of each Insulated Gate Bipolar Transistor.

11. The packaging of claim 1, wherein said direct bonded copper substrate includes a direct bonded copper beryllium oxide substrate.

12. The packaging of claim 1, wherein said at least one electronic device includes three first semiconductor power devices and three second semiconductor power devices having respective heat generating surfaces, each of the three second semiconductor power devices being respectively connected to one of said three first semiconductor power devices to form three pairs of power devices, said packaging further including:

a propulsion battery having first and second bus bars, the first bus bar being connected to the wing; and a 3-phase electrical traction motor having three terminals, each terminal being connected to a respective one of said three pairs of power devices.

13. The packaging of claim 12, further including:

a second direct bonded copper substrate having a first surface soldered to the heat generating surfaces of said three second electronic devices;

at least one capacitance connected between the first and second bus bars; and said heat sink is a liquid cooled heat sink soldered to said direct bonded copper substrate and to said second direct bonded copper substrate.

14. The packaging of claim 1, wherein said at least one electronic device includes at least one semiconductor power device having a first connection point, the packaging further including:

a second surface on said direct bonded copper substrate, said second surface including a copper layer forming a ring;

a wirebond electrically connecting said second surface directly to the first connection point of said semiconductor power device.

15. The packaging of claim 14, further including:

an electrically conductive lid secured directly to said second surface of said direct bonded copper substrate, the lid forming a hermetic seal for the at least one semiconductor power device.

16. The packaging of claim 15, further including:

a plurality of said semiconductor power devices arranged on a first copper layer of said direct bonded copper substrate, the first copper layer being the first surface and being electrically insulated from said second surface by an insulating layer of said direct bonded copper substrate, each of said semiconductor power devices having a first connection point and also having a respective heat generating surface soldered to the first copper layer;

a first common conduction pad disposed to one side of said plurality of connection points such that a shortest distance between an edge of said conduction pad to the connection point of a first one of said semiconductor power devices differs from a shortest distance from the edge to the connection point of a second one of said semiconductor power devices; and a plurality of said wirebonds, each wirebond being of equal length, one of said wirebonds being connected to the first connection point of the first semiconductor power device and to said first common conduction pad, and another of said wirebonds being connected to the first connection point of the second semiconductor power device and to said first common conduction pad, such that said first and second semiconductor power devices are connected in parallel to said first common conduction pad.

17. The packaging of claim 16, wherein said semiconductor power devices are Insulated Gate Bipolar Transistors.

18. The packaging of claim 1, wherein said direct bonded copper substrate further includes a third surface separated from and generally coplanar with the first surface, the third surface extending beyond a second edge of the substrate portion of said direct bonded copper substrate thereby forming a second wing.

19. The packaging of claim 18, wherein the second edge is opposite the edge, such that the wing and the second wing extend in opposite directions from the substrate portion of said direct bonded copper substrate, the wing and the second wing being generally planar and parallel to each other.

20. The packaging of claim 1, wherein said direct bonded copper substrate further includes a third surface separated from and non-coplanar with the first surface, the third surface extending beyond a second edge of the substrate portion of said direct bonded copper substrate thereby forming a second wing.

21. The packaging of claim 20, wherein the second edge is opposite the edge, such that the wing and the second wing extend in opposite directions from the substrate portion of said direct bonded copper substrate, the wing and the second wing being generally planar and parallel to each other.

22. The packaging of claim 14, wherein said ring lies in a different plane than the first surface of said direct bonded copper substrate.

23. The packaging of claim 3, wherein the third surface of said second direct bonded copper substrate extends beyond an edge of a substrate portion of said second direct bonded copper substrate thereby forming a second wing which is generally coplanar with the third surface.

24. A packaging for an electronic device comprising:

at least one electronic device having a heat generating surface, wherein said at least one electronic device includes at least one first semiconductor power device;

a direct bonded copper substrate having a first surface in thermal contact with the heat generating surface;

a heat sink in thermal contact with a second surface of said direct bonded copper substrate;

at least one second semiconductor power device having a heat generating surface;

a second direct bonded copper substrate having a first surface soldered to the heat generating surface of said at least one second semiconductor power device; and a second heat sink soldered to a second surface of said second direct bonded copper substrate, wherein said at least one first semiconductor power device, said direct bonded copper substrate, and said heat sink form a first unit; and said at least one second semiconductor power device, said second direct bonded copper substrate, and said second heat sink form a second unit, and further wherein each of said first and second units includes respective first and second common conduction pads, the first common conduction pad of the first unit being connected to the second common conduction pad of the second unit by a load connector.

25. The packaging of claim 24, further including:
an electrically insulated mounting base for supporting the first and second units in back-to-back relation; and
an external power source having a plurality of bus bars, a first of said bus bars being electrically connected to the first common conduction pad of the first unit and a second of said bus bars being electrically connected to the first common conduction pad of the second unit.

26. The packaging of claim 25, wherein said first and second units are mounted on one side of said mounting base and said first and second bus bars lie on an opposite side of said mounting base, and further including:
a capacitor connected to the first and second bus bars and lying on the opposite side of said mounting base.

27. The packaging of claim 25, wherein said mounting base further includes quick connect/disconnect terminals electrically connected to said first and second bus bars, thereby permitting the first and second units to be quickly connected and disconnected from said mounting base.

28. The packaging of claim 25, further including:
a 3-phase electric traction motor electrically connected to said first and second units; and
a control circuit for controlling the operation of said at least one first and second semiconductor power devices so as to control the supply of power from said first and second bus bars to said 3-phase electric traction motor.

29. The packaging of claim 28, further including an electric vehicle in which said packaging is installed.

30. The packaging of claim 24, wherein said load connector is electrically conductive.

31. The packaging of claim 24, wherein the first and second surfaces of said direct bonded copper substrate lie on opposite sides of said direct bonded copper substrate, and the first and second surfaces of said second direct bonded copper substrate lie on opposite sides of said second direct bonded copper substrate.

32. The packaging of claim 24, further comprising:
a cover secured to the second side of said direct bonded copper substrate for covering at least the first semiconductor power device, the cover including a cavity formed to accept the first semiconductor power device.

33. The packaging of claim 24, wherein said load connector is a first load connector formed so as to have a plurality of spaced wings along a length of the load connector, said packaging further comprising:
a second load connector having a plurality of wings spaced at the same spacing as said first load connector, said second load connector connecting said first and second units together,
wherein, when assembled to said first and second units, the wings of said first load connector are out of alignment with the wings of said second load connector.

34. The packaging of claim 25, wherein said heat sink and said second heat sink have surfaces which abut one another when mounted in the back-to-back relation.

35. The packaging of claim 25, wherein said load connector is a first load connector having a plurality of spaced teeth along a length of the load connector, said packaging further comprising:
a second load connector having a plurality of teeth spaced at the same spacing as said first load connector, said second load connector connecting said first and second units together,
wherein, when assembled to said first and second units, said first and second load connectors lie in different planes, and the teeth of said first load connector are out of alignment with the teeth of said second load connector.

36. A packaging for an electronic device comprising:
at least one electronic device having a heat generating surface;
a direct bonded copper substrate having a first surface in thermal contact with the heat generating surface,
wherein said at least one electronic device includes at least one semiconductor power device having a respective first connection point, the packaging further including:
a second surface on said direct bonded copper substrate, said second surface including a copper layer forming a ring;
a wirebond electrically connecting said second surface to the respective first connection point; and
an electrically insulated lid secured directly to said second surface of said direct bonded copper substrate, the insulated lid forming a hermetic seal for the at least one semiconductor power device.

37. The packaging of claim 36, further including:
a plurality of said semiconductor power devices arranged adjacent one another on a first copper layer of said direct bonded copper substrate, the first copper layer forming said first surface and being electrically insulated from said second surface by an insulating layer of said direct bonded copper substrate, each of said semiconductor power devices having a respective heat generating surface soldered to the first copper layer;
a first common conduction pad; and
a plurality of said wirebonds, each wirebond being of equal length and connecting a respective first connection point to said first common conduction pad such that said plurality of semiconductor power devices are connected in parallel to said first common conduction pad.

38. A packaging for an electronic device comprising:
at least one electronic device having a heat generating surface and a first connection point;
a direct bonded copper substrate having a first surface in thermal contact with the heat generating surface;
a second surface on said direct bonded copper substrate, said second surface including a copper layer forming a ring;
a wirebond connection electrically connecting said second surface to the first connection point; and
an insulated lid secured directly to said second surface of said direct bonded copper substrate, the insulated lid forming a hermetic seal for the at least one electronic device,
wherein said insulated lid has a first length, and further wherein said first surface and said second surface of said direct bonded copper substrate extend to form a second length parallel to the first length, the second length being greater than the first length.

39. The packaging of claim 38, wherein said second surface of said direct bonded copper substrate lies on the same side of said first surface as said electronic device, said first surface being in a different plane than said second surface.

40. The packaging of claim 38, wherein the heat generating surface of said electronic device is soldered directly to the first surface of said direct bonded copper substrate.

41. The packaging of claim 38, wherein the first and second surfaces extend beyond a substrate portion of said direct bonded copper substrate, such that a length of the substrate portion, as measured parallel to the second length, is less than the second length.

42. The packaging of claim 41, wherein the length of the substrate portion, as measured parallel to the first length, is substantially equal to the first length.

43. A packaging for an electronic device comprising:

at least one electronic device having a heat generating surface;

a direct bonded copper substrate having a first surface in thermal contact with the heat generating surface;

a heat sink in thermal contact with a second surface of said direct bonded copper substrate;

a first solder connection directly connecting the first surface of said direct bonded copper substrate and the heat generating surface of said electronic device;

a second solder connection directly connecting the second surface of said direct bonded copper substrate and a first side of said heat sink; and a cover for covering the at least one electronic device, the cover including a cavity alone a first surface thereof, the cavity formed to accept the at least one electronic device, wherein the first surface is on a first side of said cover, and said cover includes a second cavity on a second side thereof, the second surface being parallel to the first surface of the cover, the second cavity being formed to accept the at least one electronic device of another packaging for another electronic device, such that said cover is sandwiched between said packagings.

44. A wirebonded package for electronic devices comprising:

at least first and second electronic devices arranged on a thermally conductive layer, each device having a respective connection point;

a first common conduction pad disposed to one side of said connection points such that a shortest distance between an edge of said conduction pad to the connection point of said first electronic device differs from a shortest distance from the edge to the connection point of said second electronic device; and first and second wirebonds of equal length, each wirebond being attached to a respective connection point and to said first common conduction pad such that said first and second electronic devices are connected in parallel to said first common conduction pad.

45. The wirebonded packaging of claim 44, wherein said thermally conductive layer includes a direct bonded copper substrate, and further wherein each electronic device has a heat generating surface soldered to said direct bonded copper substrate.

46. The packaging of claim 45, wherein there are more than two of said wirebonds and more than two of said electronic devices, said electronic devices being semiconductor power devices arranged in adjacent rows, each row extending along the edge of said first common conduction pad, and each row being at a different distance from the edge; and further wherein said plurality of wirebonds are arranged generally parallel to one another and generally perpendicular to the edge of said first common conduction pad.

47. The wirebonded packaging of claim 45, wherein each of said electronic devices is an Insulated Gate Bipolar Transistor.

48. The wirebonded packaging of claim 44, further including:

at least third and fourth electronic devices arranged on the thermally conductive layer, each having a respective second connection point;

a second common conduction pad; and third and fourth wirebonds of equal length to each other, said third and fourth wirebonds respectively connected to the second connection points and to said second common conduction pad such that said third and fourth electronic devices are connected in parallel to said second common conduction pad.

* * * * *